United States Patent [19]

Arrington et al.

[11] 3,792,387

[45] Feb. 12, 1974

[54] PUSHBUTTON TUNING SYSTEM

[75] Inventors: William Lee Arrington, Batavia; Lee Irving Merz, Williamsville, both of N.Y.

[73] Assignee: GTE Sylvania Incorporated, Seneca Falls, N.Y.

[22] Filed: Jan. 26, 1973

[21] Appl. No.: 326,759

[52] U.S. Cl. .......................... 334/7, 334/15, 334/86, 338/129, 338/179

[51] Int. Cl. .......................... H03j 1/00

[58] Field of Search ...... 334/7, 14, 15, 86; 338/129, 338/179, 198

[56] References Cited

UNITED STATES PATENTS

| | | | |
|---|---|---|---|
| 3,624,582 | 11/1971 | Iwasaki | 334/7 |
| 3,251,012 | 5/1966 | Kazyk et al. | 334/7 X |
| 3,601,722 | 8/1971 | Rolf | 334/7 |
| 3,439,292 | 4/1969 | Henry | 334/15 X |

*Primary Examiner*—James W. Lawrence
*Assistant Examiner*—Saxfield Chatmon, Jr.
*Attorney, Agent, or Firm*—Norman J. O'Malley; Thomas H. Buffton; Cyril A. Krenzer

[57] ABSTRACT

A pushbutton tuner module for a signal receiver employing a voltage-dependent type tuner includes an enclosure with upper and lower portions formed to join one another to provide a plurality of aligned openings, a printed circuit board means disposed within the enclosure and including a pair of switches, a light source, and an adjustable resistance for each one of the aligned openings, and a pushbutton formed for slidable engagement with the enclosure and disposed within each one of the openings for effecting engagement and disengagement of the switches, energization and de-energization of the light source, and coupling and decoupling of the adjustable resistor to the voltage-dependent tuner.

8 Claims, 5 Drawing Figures

PUSHBUTTON TUNING SYSTEM

BACKGROUND OF THE INVENTION

Generally, pushbutton tuners utilized with signal receivers having voltage-dependent type tuners employ multiple switches for activating a light source associated with each pushbutton and for applying a given potential to the voltage-dependent tuner. Moreover, a variable resistor is ordinarily employed for fine tuning the potential applied to the voltage-dependent tuner.

In one known form of tuner apparatus, a plurality of pushbutton spindles are arranged in parallel and fine tuning is achieved through a planetary gear arrangement. Also, each pushbutton has a removal cap wherefrom an adjustment shaft becomes available upon activation of the particular pushbutton. Moreover, the adjustment shaft permits activation by a screwdriver and also provides a visual indication of the tuning position.

Although the above-mentioned apparatus has many advantages over other known apparatus and has been and still is utilized in numerous forms of signal receiving apparatus, it has been found that certain features of such apparatus do leave something to be desired in many forms of signal receiving equipment. For example, complex planetary gear systems are relatively expensive and deleteriously affect space utilization. Also, a system having a tuner indicator should have some form of light source for indicating usage. Moreover, a single pushbutton wherein is included a light source indicating usage and a means for effecting fine tuning would be particularly advantageous.

OBJECTS AND SUMMARY OF THE INVENTION

An object of the present invention is to provide an enhanced signal receiver employing a voltage-dependent tuner responsive to a pushbutton tuner module. Another object of the invention is to provide an improved pushbutton tuner module for a signal receiver. Still another object of the invention is to provide an improved pushbutton tuner module of relatively simple and inexpensive construction. A further object of the invention is to provide an improved pushbutton tuner module wherein each pushbutton serves an an enclosure for an individual light source and fine tuning arrangement.

These and other and further objects, advantages and capabilities are achieved in one aspect of the invention by a pushbutton tuner module having an envelope with upper and lower portions formed for jointure to provide aligned openings, a circuit board within the enclosure and having a pair of switches, a light source, and an adjustable resistor means for each opening, and a pushbutton for each opening wherein is contained the light source and an adjustable resistor means.

PREFERRED EMBODIMENT OF THE INVENTION

For a better understanding of the present invention, together with other and further objects, advantages and capabilities thereof, reference is made to the following disclosure and appended claims in conjunction with the accompanying drawings.

Figure 1:
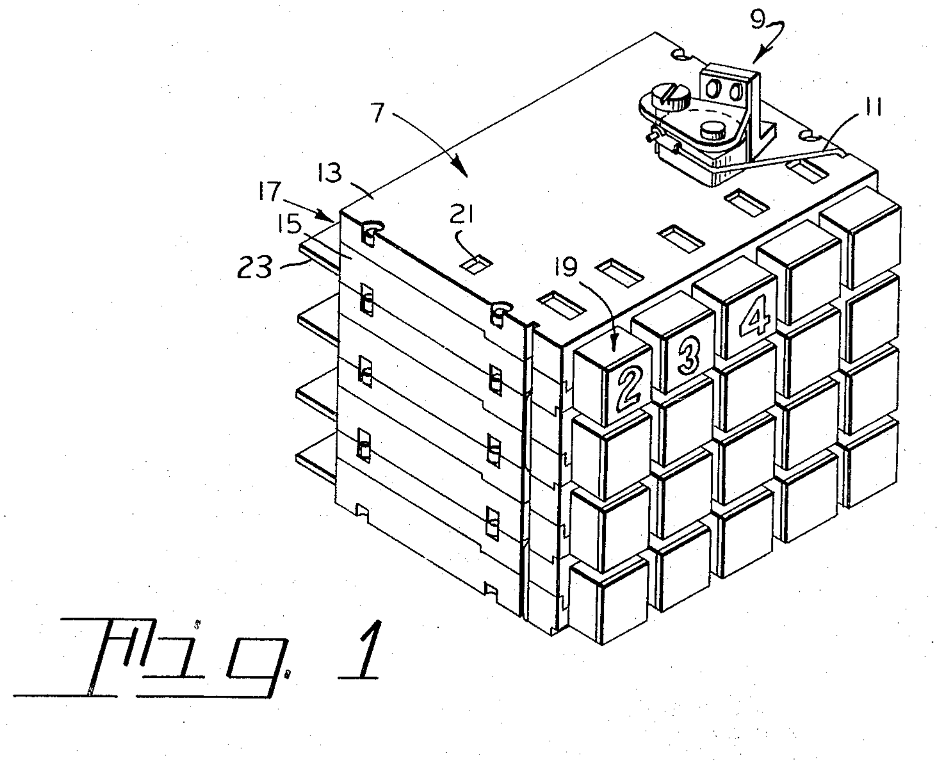
FIG. 1 is an isometric view of a plurality of pushbutton tuner modules suitable for use in a signal receiver and includes a cable tensioning means.

In the drawings, FIG. 1 illustrates a plurality of pushbutton tuner modules 7 arrayed in a stack to provide a unit suitable for use in a signal receiver. A cable tensioning device 9 is affixed to one of the modules 7 and connected to a cable 11 which interlaces the modules 7.

Each one of the modules 7 includes an upper portion 13 and a lower portion 15 formed for jointure therebetween to provide an enclosure 17. The enclosure 17 forms a plurality of aligned openings with a pushbutton 19 disposed within each of the openings and in slidable engagement with the enclosure 17. Moreover, the enclosure 17 includes a plurality of apertures 21 on one surface and protuberances (not shown) on the other surface and is formed for interlocking therebetween to provide a multiple-module unit suitable for use in a television receiver.

Figure 2:
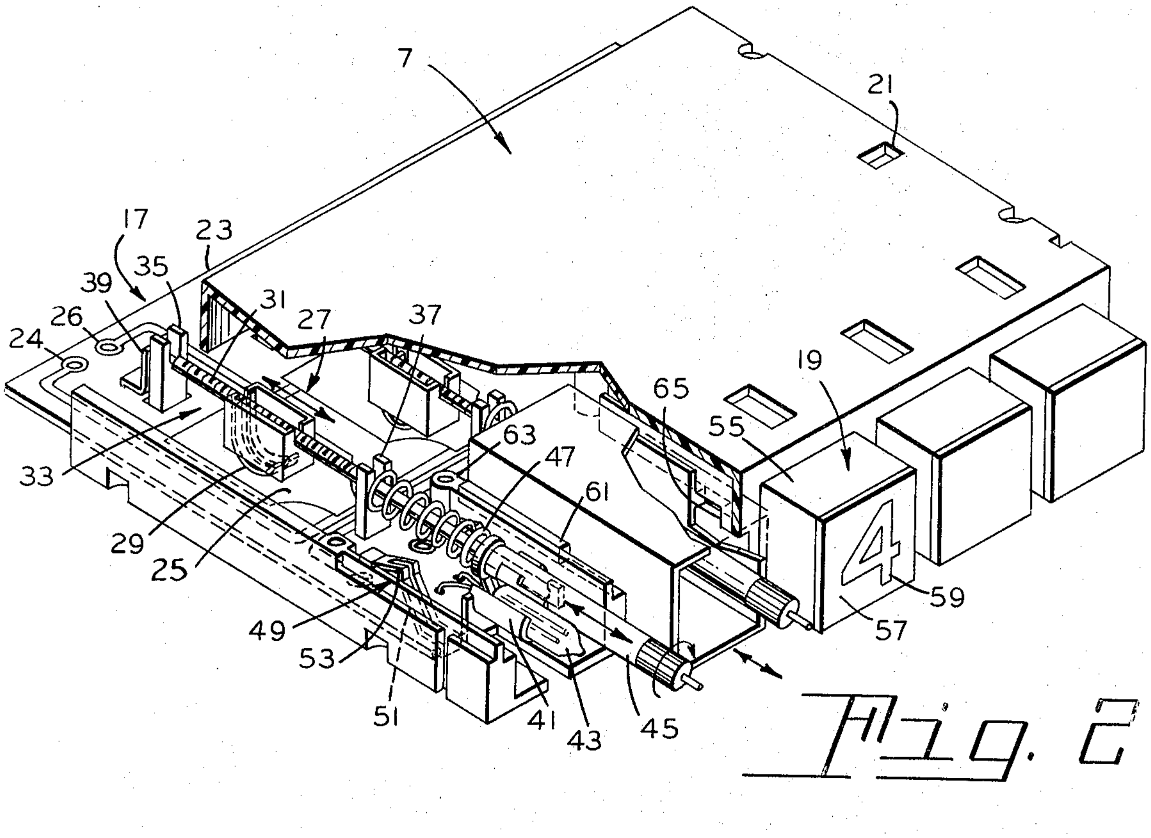
FIG. 2 is an isometric view, partially cut-away, of a single pushbutton module.

As best shown in FIG. 2, the pushbutton tuner module 7 includes a printed circuit board 23 disposed within and extending outwardly from the enclosure 17. As can be readily seen, circuit board 23 extends outward in a direction opposite from the pushbutton 19 and the opening formed by the enclosure 17.

The printed circuit board 23 has a fixed resistor 25 printed thereon with opposite ends connected to a pair of electrical conductors 24 and 26 intermediate a potential source and a potential reference level (not shown). A slider 27 has a contact arm 29 electrically and mechanically contacting the resistor 25 of the circuit board 23 and also contacting a threaded metal screw member 31 to provide an adjustable impedance 33.

The threaded metal screw member 31 is supported by a pair of upstanding post members 35 and 37 affixed to the inner surface of the enclosure 17. A connector 39 electrically and mechanically contacts one end of the metal screw member 31 and is affixed to the circuit board 23.

Also, an electrical insulator support member 41 is affixed to the circuit board 23 and a light source 43 in the form of a lamp bulb is supported thereby. A hollow cylindrical adjustable insulator 45 is rotatably supported by the insulator support member 41 and telescoped over the end of and in engagement with the screw member 31 opposite from the end associated with the connector 39. Moreover a spring member 47 is also telescoped over the screw member 31 and longitudinally confined intermediate one of the upstanding post members 37 and the hollow cylindrical adjustable insulator 45.

A pair of switch members 49 (one shown) are affixed to the printed circuit board 23 on opposite sides of the insulator support 41, light source 43, and hollow cylindrical adjustable insulator 45. Also, each one of the switch members 49 includes a spring-like portion 51 bent to form an apex 53. Moreover, the switch members 49 serve to provide electrical connection of a power source (not shown) to the light source 43 and a potential from the connector 39 to the adjustable impedance 33 to a potential responsive tuner (not shown) of a signal receiver. Obviously, a multiple contact switch could be employed for the pair of switch members 49.

Additionally, each one of the pushbuttons 19 includes a body portion 55 and a removable end cap portion 57 having channel identifying indices 59 thereon. The body portion 55 of each one of the pushbuttons 19 includes an outward extending lug 61 formed for contact with a fastening means 63 of the enclosure 17 to limit inward movement of the pushbutton 19 and for contact with an offset 65 of the enclosure 17 whereby outward movement of the pushbutton 19 is limited.

Figure 3:
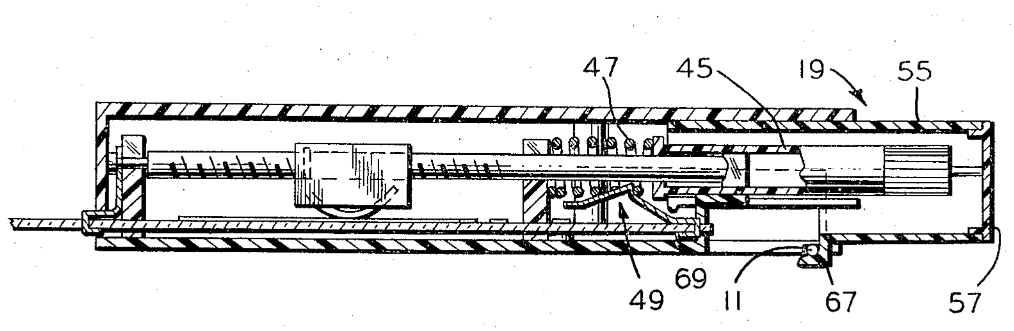
FIGS. 3–5 are sectional views of the pushbutton tuner module of FIG. 1.

Further, FIG. 3 illustrates a pushbutton 19 in a non-activated positional location. Herein, the spring member 47 is in a partially compressed condition due to the pressure exerted thereon by the hollow cylindrical adjustable insulator 45. Also, this adjustable insulator 45 exerts this pressure on the spring member 47 due to the pressure of the end cap 57 of the pushbutton 19. It may be noted that the body portion 55 of the pushbutton 19 has a hook-like member 67 in engagement with the cable 11.

Figure 4:
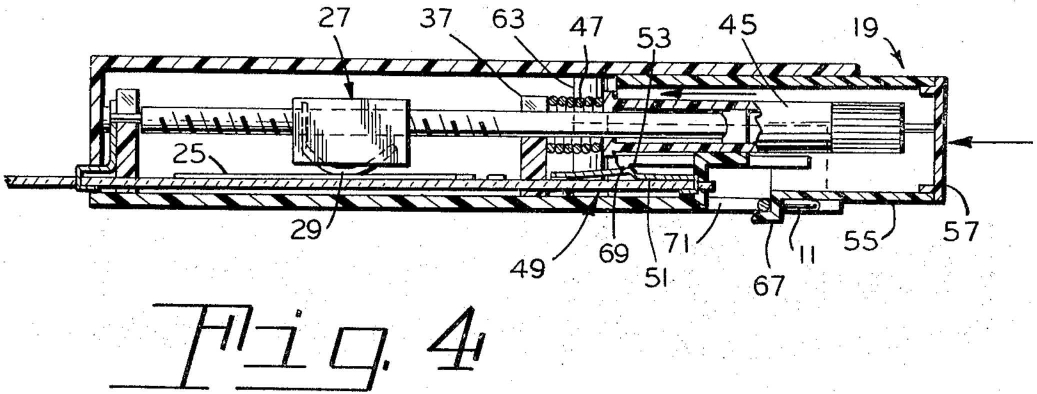

In FIG. 4, the pushbutton 19 is shown in an activated positional location. Herein, the spring member 47 is compressed due to the pressure thereon by the hollow cylindrical adjustable insulator 45 which is, in turn, in contact with the end cap 57 of the pushbutton 19. The switch members 49 (one shown) are activated by the body portion 55 of the pushbutton 19 and latched in the activated position by a bump 69 of the body portion 55 which passes over and is restrained by the apex 53 of the spring like portion 51 of the switch members 49. Moreover, it can be seen that the hook-like member 67 of the pushbutton 19 has moved inwardly by way of a slot 71 whereupon pressure between the cable 11 and the hook-like member 67 is developed.

Figure 5:
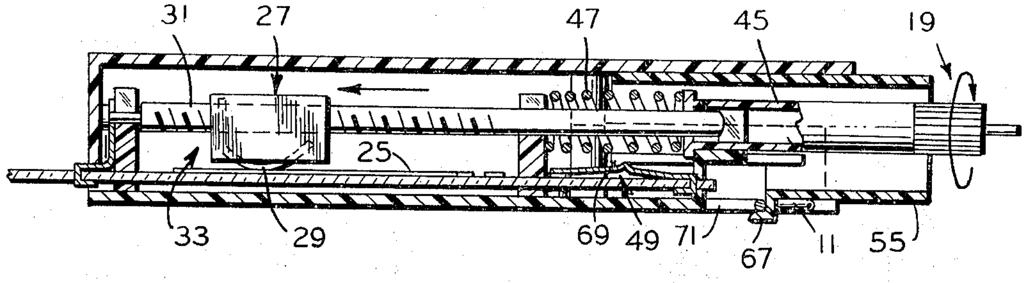

Further, FIG. 5 illustrates the pushbutton 19 in the activated positional location with the end cap 57 of the pushbutton 19 removed. As can be seen, removal of the end cap 57 releases the pressure exerted on the spring member 47 whereupon the hollow cylindrical adjustable insulator 45 protrudes from the body portion 55 of the pushbutton 19. Thereupon, rotational adjustment of the insulator 45 causes longitudinal movement of the slide 27 and contact arm 29 due to the threaded metal screw member 31. Thus, the adjustable impedance 33 is altered whereupon the potential applied via the switch member 49 to a potential responsive tuner (not shown) is altered and tuning of a particular channel is effected.

To review the operational details, a multiple-module unit suitable for use in a television receiver includes a plurality of interlocked tuner modules 7 interlaced by a cable 11 having a desired tensional pressure as determined by the cable tensioning device 9. Each of the modules 7 includes an enclosure 17 forming a plurality of aligned openings wherein a pushbutton 19 in slidable engagement with the enclosure 17 is disposed.

A printed circuit board 23 within the enclosure 17 has a fixed resistor 25 thereon for each of the openings. A slider 27 having a contact arm 29 contacting the resistor 25 is affixed to a threaded metal screw member 31 supported within the enclosure 17. The screw member 31 contacts an electrical connector 39 and also has a spring member 47 telescoped thereover and positionally held by an upstanding post member 37 and a hollow cylindrical adjustable insulator 45 rotatably supported by an insulator support 41. Also, the insulator support 41 positionally holds a light source 43.

A pair of switch members 49 for each of the openings provide electrical connections to the light source 43 and to the resistor 25 via the slider 27. Also, each of the switch members 49 includes an apex 53 while each of the pushbuttons 19 includes a bump 69 whereby latching of the switch members 49 is effected.

A hollow cylindrical adjustable insulator 45 is confined by an end cap 57 of each of the pushbuttons 19 and upon removal thereof permits longitudinal adjustment of the slider 47 by rotation of the insulator 45. Moreover, this adjustment in tuning is effected during energization of the system with the light source activated.

Thus, there has been provided a unique pushbutton tuner module whereby each channel is selected by activation of a particular pushbutton. Also, each pushbutton has contained therein a light source for indicating activation of the pushbutton and selection of a particular channel as well as a fine tuning adjustment for the particular channel selected.

Further, the inexpensive but highly effective cable technique for unlatching one pushbutton upon activation of a second pushbutton is especially adapted to multiple-module units suitable for signal receivers. Moreover, the threaded screw member provides fine tuning of a quality especially suitable to signal receivers.

While there has been shown and described what is at present considered the preferred embodiment of the invention, it will be obvious to those skilled in the art that various changes and modifications may be made therein without departing from the invention as defined by the appended claims.

What is claimed is:

1. A pushbutton tuner module for a signal receiver having a voltage dependent tuner means comprising:

enclosure means having upper and lower portions formed for attachment therebetween and providing a plurality of aligned openings;

printed circuit board means disposed within said enclosure and including for each one of said aligned openings a pair of electrical switching means each having a spring member with an apex, a light source, and an adjustable resistance;

pushbutton means formed for engagement with said enclosure and disposed within each one of said aligned openings, each of said pushbutton means having a bump for pressure engagement with said apex of said spring member to effect latching of said pushbutton upon inward movement thereof and adapted to be slidable inwardly and outwardly within said opening to effect engagement and disengagement of said pair of electrical switches causing energization and de-energization of said light source and coupling and decoupling of said adjustable resistor to said voltage-dependent tuner for varying the tuning of said signal receiver.

2. The tuner module of claim 1 wherein said enclosure forming said plurality of aligned openings includes a groove extending normal to said openings and a slot extending along the longitudinal axis of each one of said aligned openings, each one of said pushbuttons includes a finger member extending normal to the longitudinal axis thereof and inwardly and outwardly slidable within said slot, and cable means fastened at opposite ends and disposed within said groove to provide engagement with said finger member of a pushbutton moved inwardly of said opening into an operable position.

3. The pushbutton tuning module of claim 1 wherein each one of said adjustable resistances includes a fixed resistance printed onto said printed circuit board and electrically connected intermediate a potential source and a potential reference level; a threaded metal screw member affixed to said enclosure and electrically connected to one of said pair of switching means; a slider member affixed in electrical and mechanical engagement intermediate said threaded metal screw member and said fixed resistance; a spring telescoped over said screw member and contacting said enclosure means; and screw turning means telescoped over and in engagement with said threaded metal screw member and in contact with said spring and supportedly affixed to said enclosure means.

4. The pushbutton tuning module of claim 3 wherein each one of said pushbutton means includes an end portion having indicia thereon with said end portion confining said screw turning means within said pushbutton by compression of said spring and said screw turning member extending outwardly of said pushbutton upon removal of said end portion and expansion of said spring.

5. The pushbutton tuning module of claim 3 wherein said indicia of said end portion of a pushbutton is illuminated by said light source therein upon inward movement of said pushbutton.

6. In a signal receiver having a voltage dependent tuner, a pushbutton tuner module comprising:

an enclosure having upper and lower portions formed for jointure therebetween to provide a plurality of aligned openings;

a printed circuit board formed for disposal intermediate said upper and lower portions of said enclosure and extending outwardly therefrom in a direction opposite said aligned openings, said printed circuit board having associated therewith for each one of said aligned openings a pair of electrical switches each having a spring member with an apex, a light source, and a resistor formed for adjustment in resistance values; and a pushbutton for each one of said aligned openings, each of said pushbuttons disposed within one of said openings of said enclosure having a bump for pressure engagement with said apex of said spring member to effect latching of said pushbutton upon inward movement thereof and in slidable engagement with said enclosure and formed for effecting engagement and disengagement of said pair of electrical switches, energization and de-energization of said light source, and coupling and decoupling of said resistor to said tuner of said signal receiver.

7. The pushbutton tuner module of claim 6 wherein said resistor formed for adjustment in resistance values of said printed circuit board is in the form of a printed resistance affixed to said circuit board; a slider member electrically and mechanically contacting said printed resistance; a threaded metal screw member mechanically and electrically associated with said slider member, said enclosure, and said electrical switches; and a screw turning means telescoped over said metal screw member and affixed in support relationship to said enclosure.

8. The pushbutton tuner module of claim 7 wherein said resistor formed for adjustment in resistance value includes a spring member telescoped over said threaded metal screw member and intermediate said envelope and said screw turning means.

* * * * *